United States Patent
Yamada et al.

(10) Patent No.: US 7,176,060 B2
(45) Date of Patent: Feb. 13, 2007

(54) INTEGRATED CIRCUIT CARD AND A METHOD OF MANUFACTURING THE SAME

(75) Inventors: Nobuaki Yamada, Musashino (JP); Kazunari Suzuki, Tokyo (JP); Bunshi Kuratomi, Kodaira (JP); Hiroaki Tanaka, Kodaira (JP); Akira Onozawa, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/902,024

(22) Filed: Jul. 30, 2004

(65) Prior Publication Data

US 2005/0052851 A1 Mar. 10, 2005

(30) Foreign Application Priority Data

Sep. 10, 2003 (JP) ............... 2003-318099

(51) Int. Cl.
*H01L 21/00* (2006.01)

(52) U.S. Cl. ...................... 438/112; 438/113

(58) Field of Classification Search .................. 438/33, 438/112, 113, 127, 68; 361/737; 257/679, 257/680, 684, 685
See application file for complete search history.

(56) References Cited

U.S. PATENT DOCUMENTS

| | | | |
|---|---|---|---|
| 5,635,220 A * | 6/1997 | Izumi et al. ................ | 425/116 |
| 5,920,768 A * | 7/1999 | Shintai ...................... | 438/112 |
| 6,159,770 A * | 12/2000 | Tetaka et al. ............... | 438/112 |
| 6,171,888 B1 * | 1/2001 | Lynch et al. ................ | 438/123 |
| 6,177,288 B1 * | 1/2001 | Takiar ......................... | 438/15 |
| 6,180,435 B1 * | 1/2001 | Ise et al. ..................... | 438/113 |
| 6,669,487 B1 | 12/2003 | Nishizawa et al. | |
| 6,727,114 B2 * | 4/2004 | Wada et al. ................ | 438/106 |
| 6,927,096 B2 * | 8/2005 | Shimanuki ................. | 438/113 |
| 2002/0124392 A1 * | 9/2002 | Chung ......................... | 29/739 |
| 2003/0071365 A1 * | 4/2003 | Kobayakawa et al. ...... | 257/787 |
| 2004/0032013 A1 * | 2/2004 | Cobbley et al. ........... | 257/678 |

FOREIGN PATENT DOCUMENTS

| | | |
|---|---|---|
| JP | 2001-344583 | 12/2001 |
| WO | WO 02/13021 | 2/2002 |

* cited by examiner

*Primary Examiner*—Matthew Smith
*Assistant Examiner*—Khiem Nguyen
(74) *Attorney, Agent, or Firm*—Antonelli, Terry, Stout and Kraus, LLP.

(57) ABSTRACT

A multi-function structure of a plug-in universal IC card is to be promoted and the manufacturing cost is to be reduced. The body of the plug-in UICC is constructed of a molding resin. A tape substrate and a chip mounted on one side of the tape substrate are sealed in the interior of the molding resin. A side opposite to the chip mounting side of the tape substrate is exposed to the exterior of the molding resin and constitutes a surface portion of the plug-in UICC. Contact patterns serving as external terminals of the plug-in UICC are formed on the surface of the tape substrate exposed to the exterior of the molding resin. In the plug-in UICC whose body is constructed of molding resin, cracking of the chip can be prevented effectively even in the case where the chip is large-sized.

12 Claims, 21 Drawing Sheets

INTEGRATED CIRCUIT CARD AND A METHOD OF MANUFACTURING THE SAME

CROSS-REFERENCE TO RELATED APPLICATION

The present application claims priority from Japanese Patent application JP 2003-318099, filed on Sep. 10, 2003, the content of which is hereby incorporated by reference into this application.

BACKGROUND OF THE INVENTION

The present invention relates to a method of manufacture of an integrated circuit (IC) card. Particularly, the present invention is concerned with a technique that is effective in the manufacture of a plug-in universal IC card for a portable telephone.

Recently, a portable telephone, which utilizes a GSM (Global System for Mobile Communications) system, has enjoyed widespread use throughout the world. For using a portable telephone based on the GSM system, an SIM (Subscriber Identity Module) card, representing a kind of IC card that is issued by a portable telephone company and on which subscriber information is recorded, is inserted into the portable telephone. This portable telephone is advantageous in that the same telephone number is employable even if the portable telephone is replaced with another one.

According to IMT-2000 (International Mobile Telecommunication 2000), which is a standard for the next generation portable telephone, not only is the same telephone number employable by only changing IC cards even between portable telephones based on different systems, but also it is expected that the function of the portable telephone will be further extended.

According to the IMT-2000 standard, there is a universal IC card (UICC; Plug-in Universal Integrated Circuit Card) which is an upward compatible card having an extended function from the function of the standard SIM card. As examples of universal IC cards, there are a plug-in type and a standard IC card type, which is larger in size. By adding various functions, such as a credit function and an M commerce (mobile commerce) function, in addition to the telephone number and subscriber's personal information, to an IC chip incorporated in a universal IC card, it is possible to realize a multi-function structure in a portable telephone.

Japanese Unexamined Patent Publication No. 2001-344583 (Patent Literature 1) discloses an improved technique for a plug-in SIM card. It has been known to ship such a plug-in SIM card in a state in which it is fixed to a part of a frame card having a standard IC card size; then, when it is to be used, it is cut off from the frame card and is inserted into a portable telephone, while the frame card which has become unnecessary is discarded as waste. However, discarding the frame card is not desirable from the standpoint of saving resources and environmental conservation. For this reason, the above-referenced Patent Literature 1 proposes a technique in which a magnetic storage portion is provided in part of the plug-in SIM card and various pieces of information heretofore printed on the surface of the frame card are stored in the magnetic storage portion, thereby making the frame card unnecessary.

[Patent Literature 1]

Japanese Unexamined Patent Publication No. 2001-344583

SUMMARY OF THE INVENTION

The plug-in SIM card used in a portable telephone based on the GSM system has a construction wherein a semiconductor chip (hereinafter referred to simply a as "chip") is embedded in a resinous plug-in card having external dimensions of 15 mm long, 25 mm wide and 0.76 mm thick.

The above-mentioned chip is mounted on one side of a thin tape substrate having a thickness of about 160 mm, and it is sealed with a potting resin. In the plug-in card, there is a cavity for embedding the resin-sealed chip therein. The substrate is cut in conformity with the shape of the cavity and it is then affixed to the plug-in card, whereby the chip is embedded in the cavity. On the opposite side of the tape substrate (the surface side of the card) there are contact patterns (external terminals) which are connected to the chip through Au wires.

On the other hand, the plug-in universal IC card ("plug-in UICC" hereinafter) used in the IMT-2000 system, according to the specification thereof, is constructed to have the same external dimension as the plug-in SIM card. However, for extending the function of the portable telephone, an increase in the size of the chip incorporated in the card or a multi-chip structure is required. As to the existing plug-in SIM cards having the above-mentioned structure, however, studies made by the present inventors show that mounting a large-sized chip or implementing a multi-chip structure is difficult for the following reason.

First, for embedding the chip mounted on the tape substrate into the cavity of the plug-in card, it is necessary to affix the tape substrate to the plug-in card with use of an adhesive. To meet this requirement, a shallow groove of 1 to 2 mm in width, which functions as an "allowance for adhesive," is formed along the cavity on the surface of the plug-in card. However, with such a groove on the surface of the plug-in card, the inside diameter of the cavity cannot be expanded to near the card size (15 mm×25 mm).

In case of forming a cavity in a resinous plug-in card, from the standpoint of ensuring the strength of the card and preventing the interior of the cavity from being transparent, it is necessary to ensure at least 0.2 mm as the resin thickness of the bottom of the cavity. As a result, the height of the cavity cannot be expanded to near the card thickness (0.76 mm).

In an existing plug-in SIM card, since the size of a chip mounted on a tape substrate is small, the sealing of the chip is effected by mainly using a potting resin. However, when the chip size is to be enlarged, it is difficult to prevent cracking of the chip as long as a soft potting resin is used. In this case, it is required to use a molding resin which is higher in flexural strength than the potting resin.

When the chip mounted on one side of the tape substrate is to be sealed with a molding resin, the resin is injected into a cavity while the tape substrate is pinched between an upper die half and a lower die half of a molding die. In this case, it is necessary that the outer peripheral ends of a mold cavity formed in the upper die half be positioned about 2 mm inside the outer peripheral ends of the contact patterns formed on a back surface of the tape substrate. This is because, if the aforesaid size is smaller, at the time of pinching the tape substrate between the upper and lower die halves, an excessive pressure will be exerted on the outer peripheral ends of the contact patterns and, consequently, the surfaces of the contact patterns will be impressed by the die, which causes a poor appearance.

For preventing such impressions of the contact patterns by the molding die, it is necessary that the outer peripheral ends of the mold cavity be disposed 2 mm or more inside the outer peripheral ends of the contact patterns to increase the area of the region where the upper die half and the contact patterns overlap with each other, thereby decreasing the pressure per unit area applied to the contact patterns. Therefore, a limit is encountered in expanding the outer peripheral ends of the mold cavity outwards to enlarge the inside diameter of the cavity (=external dimension of the molding resin), and thus it is difficult to seal a large-sized chip with resin.

Thus, in the conventional plug-in SIM card, since the volume of the cavity in the plug-in card is limited, it is difficult to mount a large-sized chip or increase the number of chips. Accordingly, in the case where the plug-in SIM card of the conventional structure is applied to a plug-in UICC, it is difficult to expand the function of the portable telephone.

Moreover, in the plug-in SIM card of the conventional structure, it is necessary to carry out an assembling work of affixing the tape substrate to a plug-in card after resin-sealing the chip that is mounted on one side of the tape substrate. Consequently, not only does the assembling process become complicated, but also a continuous assembling work using a long tape substrate cannot be performed, and, hence, the manufacturing cost becomes high.

It is an object of the present invention to provide a technique for promoting a multi-function structure of a plug-in UICC.

It is another object of the present invention to provide a technique for decreasing the manufacturing cost of a plug-in UICC.

The above and other objects and novel features of the present invention will become apparent from the following description and the accompanying drawings.

Typical modes of the present invention as disclosed herein will be outlined below.

In a plug-in UICC according to the present invention, a body is constructed of a molding resin, a tape substrate and a semiconductor chip mounted on one side of the tape substrate are sealed in the interior of the molding resin, and external terminals are formed on the opposite side of the tape substrate which is exposed to the exterior of the molding resin.

A method of manufacturing the above-described plug-in UICC according to the present invention comprises the steps of:

(a) providing a tape substrate, the tape substrate having a plurality of chip mounting areas on one side thereof and external terminal patterns formed on opposite sides respectively of the plural chip mounting areas;

(b) mounting semiconductor chips respectively on the plural chip mounting areas of the tape substrate;

(c) connecting back surfaces of the external terminal patterns that are exposed into a plurality of bonding holes formed in the tape substrate and the semiconductor chips electrically with each other through wires;

(d) loading the tape substrate into a molding die and sealing each of the plural semiconductor chips that are mounted on the one side of the tape substrate with a molding resin; and (e) cutting the tape substrate along an outer periphery of the molding resin by means of a press to divide the molding resin into individual pieces.

The following is a brief description of effects obtained by typical modes of the present invention as disclosed herein.

By constructing the body of the plug-in UICC with use of a molding resin, it is possible to increase the size of each chip and the number of chips to be mounted on the card, so that the function of the portable telephone can be extended easily.

Moreover, since a continuous assembling work using a long tape substrate can be carried out, it is possible to simplify the assembling process for the plug-in UICC and reduce the manufacturing cost thereof.

DETAILED DESCRIPTION OF PREFERRED EMBODIMENTS

Figure 1:
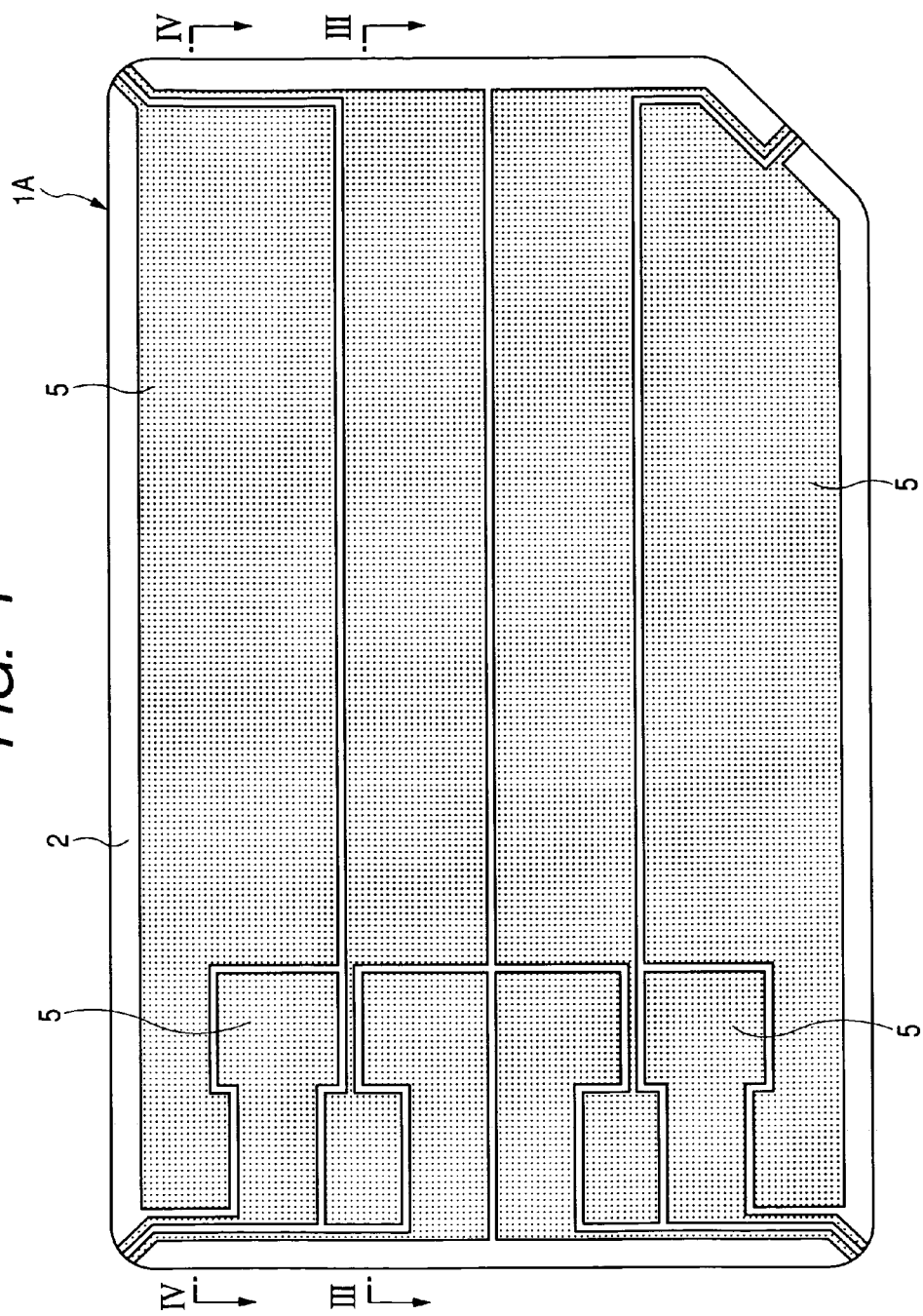
FIG. 1 is a plan view showing an example of the appearance of a plug-in UICC according to a first embodiment of the present invention.

Embodiments of the present invention will be described in detail hereinunder with reference to the accompanying drawings. In all of the drawings the same components are identified by the same reference numerals, and repeated explanations thereof will be omitted.

First Embodiment

Figure 2:
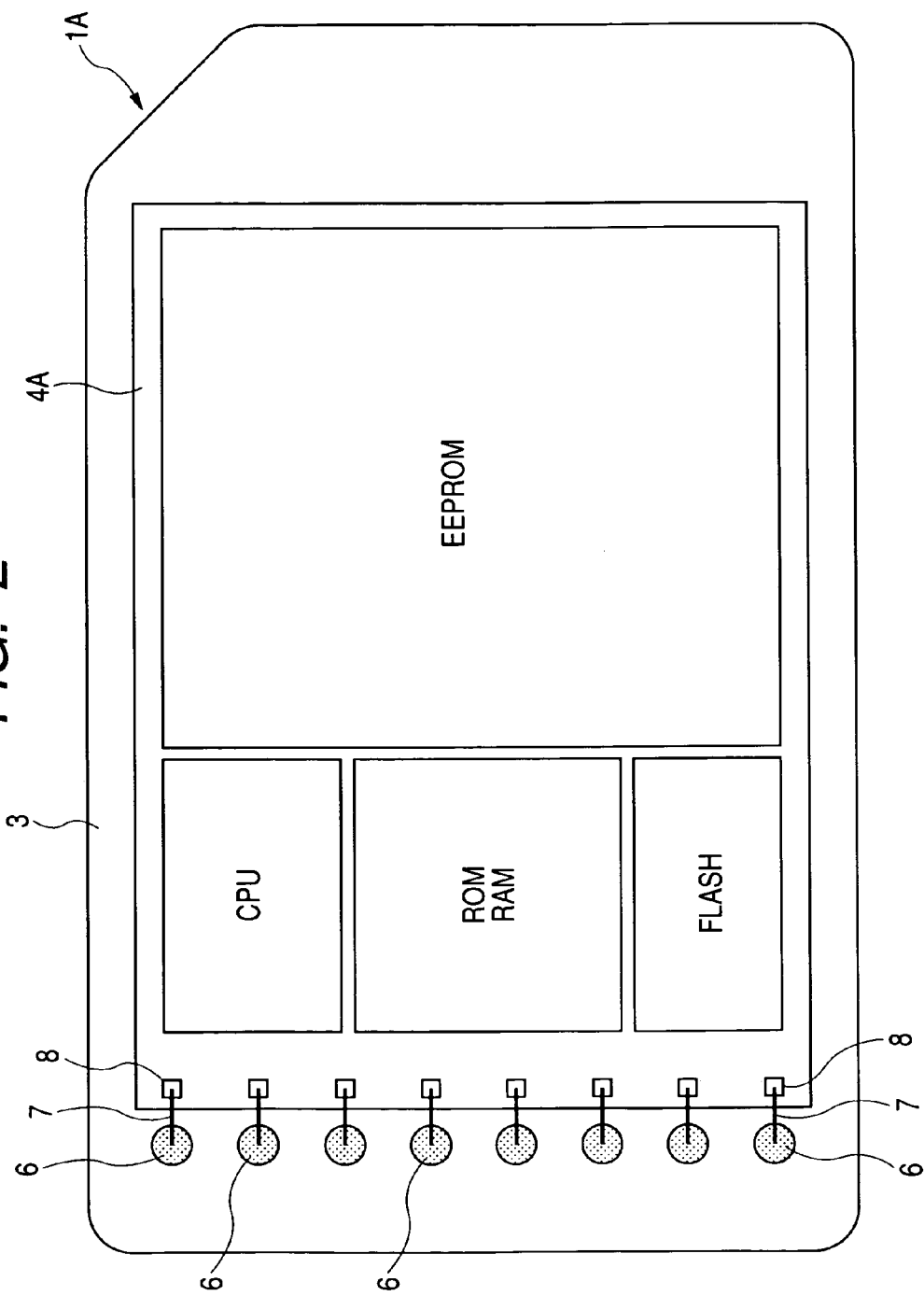
FIG. 2 is a plan view showing an example of the internal structure of the plug-in UICC as seen from a back surface side thereof.
Figure 3:
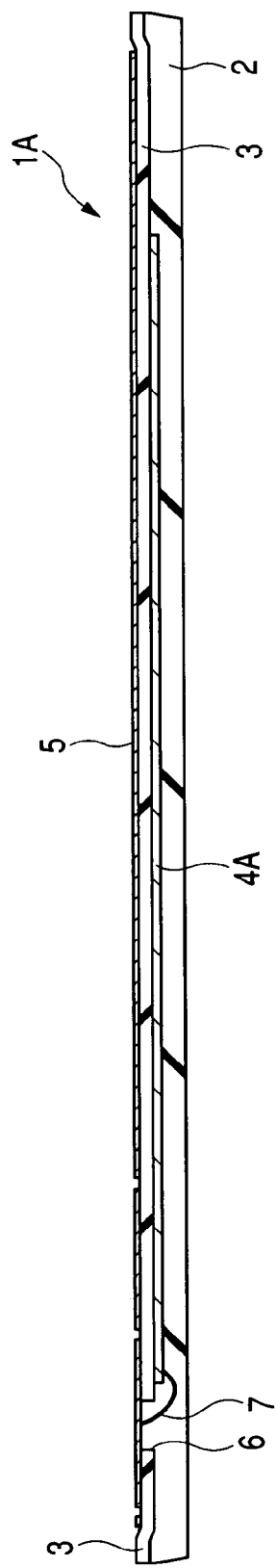
FIG. 3 is a sectional view of the plug-in UICC taken along line III—III in FIG. 1.
Figure 4:
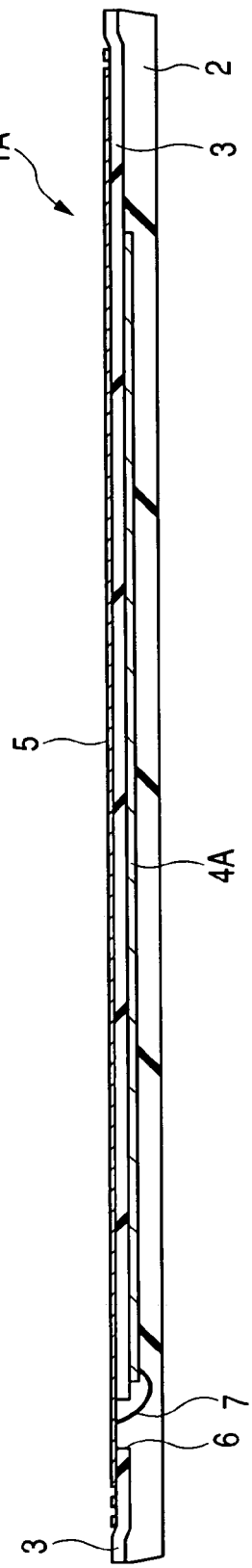
FIG. 4 is a sectional view of the plug-in UICC taken along line IV—IV in FIG. 1.

FIG. 1 is a plan view showing an example of the appearance of a plug-in UICC according to an embodiment of the present invention, FIG. 2 is a plan view showing an example of the internal structure of the plug-in UICC as seen from a back surface side thereof; FIG. 3 is a sectional view of the plug-in UICC taken on line III—III in FIG. 1; and FIG. 4 is a sectional view of the plug-in UICC taken along line IV—IV in FIG. 1.

The body of the plug-in UICC (1A) of this embodiment is constructed of a molding resin 2. A tape substrate 3 and a chip 4A mounted on one side of the tape substrate are sealed in the interior of the molding resin 2. The opposite side (opposite to the chip mounting side) of the tape substrate 3 is exposed to the exterior of the molding resin 2, and this opposite side constitutes a surface portion of the plug-in UICC (1A). Contact patterns 5, serving as external terminals of the plug-in UICC (1A), are formed on the surface of the tape substrate 3 exposed to the exterior of the molding resin 2.

The external dimensions of the plug-in UICC (1A) are 15 mm long, 25 mm wide and 0.76 mm thick in accordance with ETSI (European Telecommunications Standards Institute). One corner of the molding resin 2 which constitutes the body of the plug-in UICC is chamfered for positioning.

Each corner is formed with a fillet having a radius of 1 mm. Side faces of the molding resin 2 are tapered at an angle of about 50 to 300. This taper is formed for carrying out the cutting of the tape substrate 3 as a long tape easily and accurately at the time of cutting the tape substrate with a press into individual pieces or plug-in UICCs (1A) in the final step of the manufacturing process for the plug-in UICC (1A).

The molding resin 2 is formed of a thermosetting epoxy resin, for example. Since the molding resin 2 is high in flexural strength as compared with a potting resin, it is possible to effectively prevent cracking of the chip 4A upon exertion of an external pressure on the plug-in UICC (1A). In the plug-in UICC (1A) of this embodiment, with the body thereof constructed of the molding resin 2, the thickness of the resin (molding resin 2) which seals the chip 4A is large in comparison with the conventional plug-in SIM card with a chip embedded therein. Therefore, even in the case where the size of the chip 4A is large, it is possible to prevent cracking of the chip 4A effectively.

The chip 4A sealed in the interior of the molding resin 2 is a single crystal silicon chip on which such an integrated circuit such as shown in FIG. 2, for example, is formed by a known semiconductor device manufacturing process. Its thickness is about 0.1 mm. The chip 4A is affixed to one side of the tape substrate 3 with an adhesive. The tape substrate 3 comprises a polyimide resin-based insulating film having a thickness of about 0.12 mm and contact patterns 5 formed on the opposite side thereof (opposite to the chip mounting side). The contact patterns 5 are formed by etching Cu (copper) foil affixed to the insulating film to form patterns and thereafter plating the pattern surfaces with Ni (nickel) and Au (gold). The total thickness of the Cu foil and the plating layer is about 0.04 mm.

Figure 5:
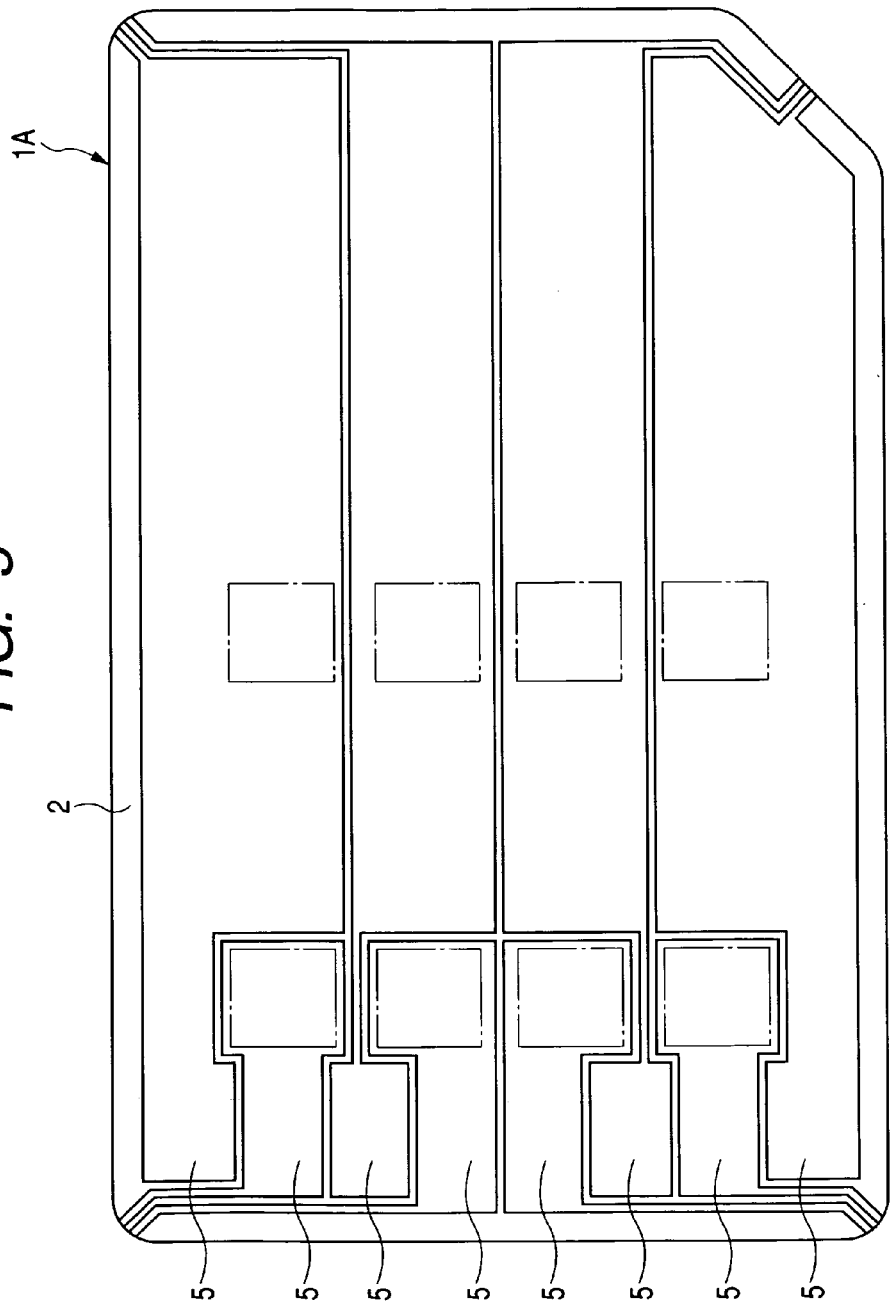
FIG. 5 is a plan view showing a correlation between contact patterns and contact positions in the plug-in UICC.

The contact patterns 5 are divided into eight terminals corresponding to eight contact positions, which are indicted with dot-dash lines in FIG. 5. One of the ends of the Au wires 7 are connected respectively to the eight terminals through bonding holes 6 formed in the tape substrate 3. The eight terminals are electrically connected to bonding pads 8 on the chip 4A through the Au wires 7. As shown in FIG. 2, the bonding holes 6 formed in the tape substrate 3 are arranged in a line near one side of the molding resin 2 so that the chip 4A, as a large-size chip, can be sealed within the molding resin 2.

The total area of the contact patterns 5 is larger than the area of the chip 4A and their peripheral edge portions are positioned outside the peripheral edge portions of the chip 4A. As a result, at the time of affixing the chip 4A to the tape substrate 3 in the manufacturing process to be described later, there is no longer any difference in height at the adhesive surface of the chip 4A (difference in height between the insulating film and the contact patterns 5) and the adhesive surface becomes flat, so that the strength of bonding between the chip 4A and the tape substrate 3 is improved. Besides, since the entire back surface of the chip 4A is uniformly covered with the two layers of tape substrate 3 and contact patterns 5, there is also obtained the effect that cracking of the chip 4A becomes difficult to occur.

Further, the peripheral edges of the contact patterns 5 are positioned inside the peripheral edges of the molding resin 2; whereby, when the tape substrate 3 is pinched between upper and lower die halves of a molding die in a molding step to be described later, there is no fear that the contact patterns may overlap with the upper die half, nor is there any fear that impressions may remain on the surfaces of the contact patterns 5 which would cause a poor appearance.

Figure 6:
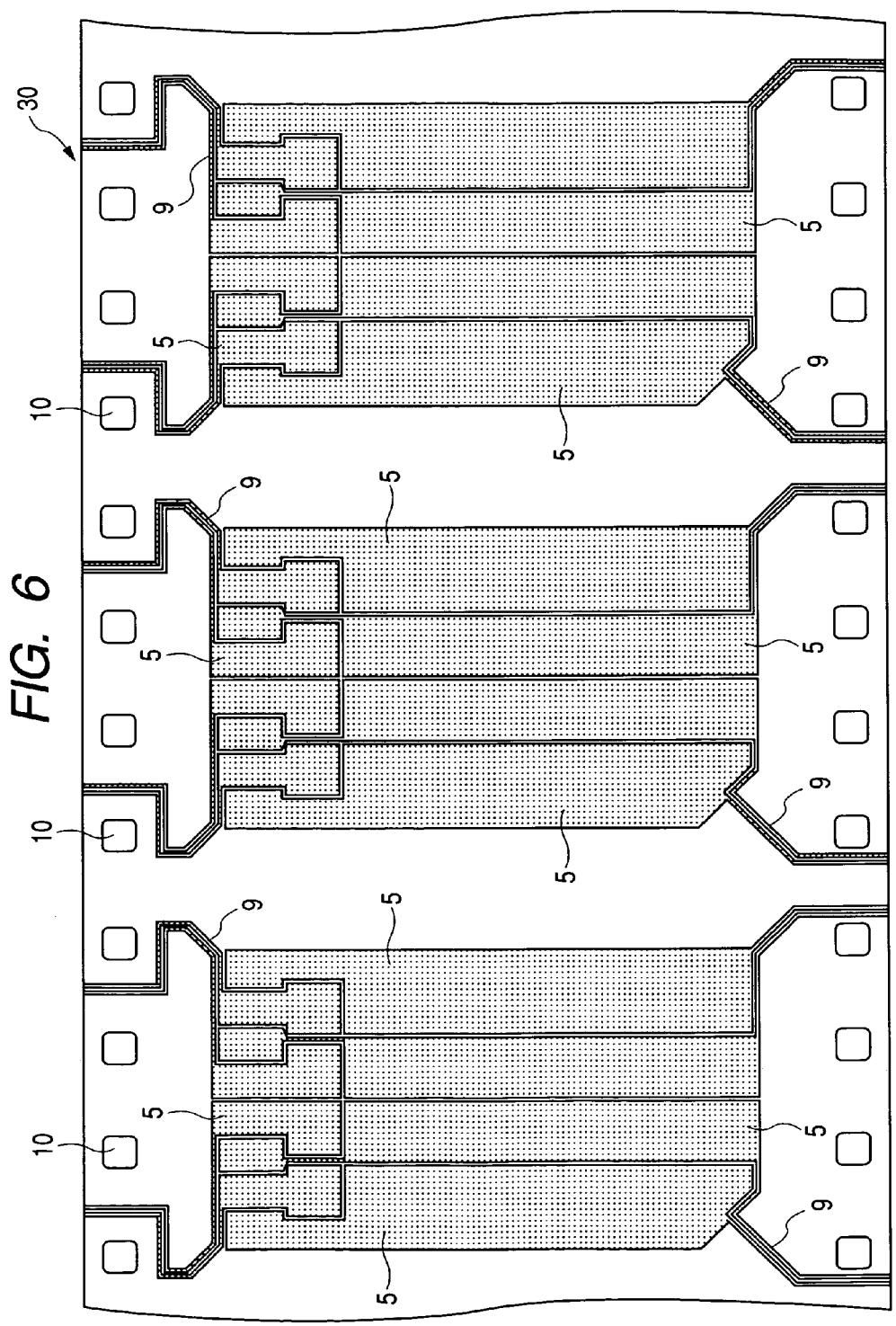
FIG. 6 is a plan view of a principal portion, showing one side (contact pattern-forming surface) of a tape substrate used in manufacturing the plug-in UICC.
Figure 7:
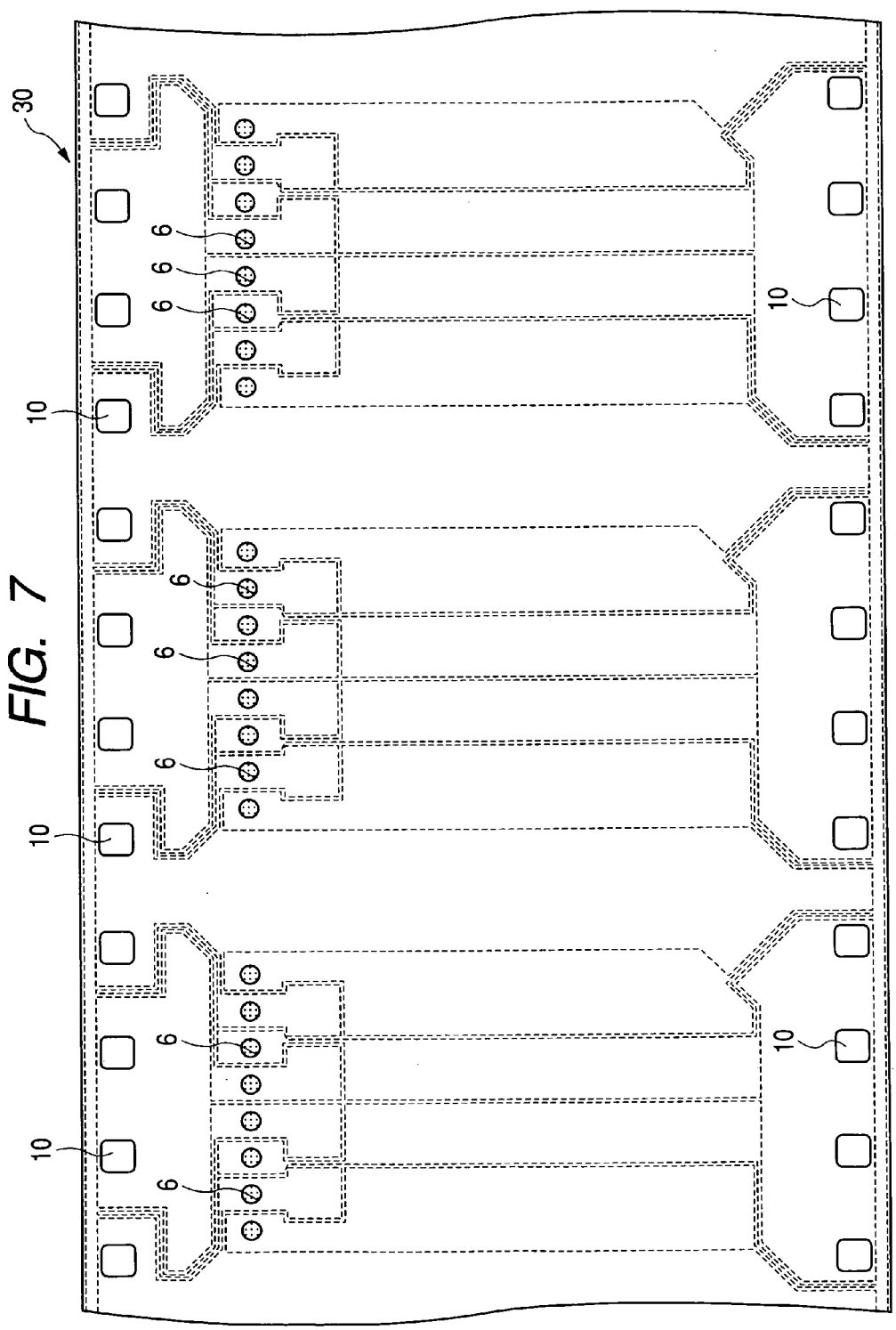
FIG. 7 is a plan view of a principal portion, showing an opposite side (chip-mounting surface) of the tape substrate used in manufacturing the plug-in UICC.

Next, a description will be given of a method to be used for manufacturing the above plug-in UICC (1A). FIG. 6 is a plan view of a principal portion, showing one side (contact pattern-forming side) of the tape substrate 30 used in fabricating the plug-in UICC (1A), and FIG. 7 is a plan view of a principal portion, showing another side (chip-mounting side) of the tape substrate 30. An actual tape substrate 30 is a long tape having a width of 35 mm on which a large number of contact patterns 5 are formed at predetermined intervals. FIGS. 6 and 7 show an area of three plug-in UICCs (1A).

As shown in FIG. 6, power supply lines 9 connected to the contact patterns 5 are formed on both side faces of the tape substrate 30. The tape substrate 30 is formed by affixing Cu foil having a thickness of about 0.04 mm to an insulating film having a thickness of about 0.12 mm, then etching the Cu foil to form contact patterns 5 and power supply lines 9 and, subsequently, plating the surfaces of the contact patterns 5 with Ni and Au, while supplying the contact patterns with an electric current through the power supply lines 9.

The Ni plating layer formed between the Cu foil and the Au plating layer is a barrier layer for preventing interdiffusion of Cu and Au. The Ni and Au plating layers may be formed by an electroless plating method instead of an electrolytic plating method. However, Au plating layer which is formed by the electrolytic plating method is more lustrous than Au plating layer formed by the electroless plating method, so that electrolyte plating contributes to an improvement in the appearance of the contact patterns 5.

Sprocket holes 10 for winding and delivering the tape substrate 30 onto and from a reel are formed at predetermined intervals in both side faces of the tape substrate 30. In a wound-up state onto the reel, the tape substrate 30 is fed to the manufacturing process, then is delivered from the reel and is subjected to various steps (chip mounting step, wire bonding step, molding step, and checking step), and then it is cut with a press into individual pieces or cards.

Figure 8:
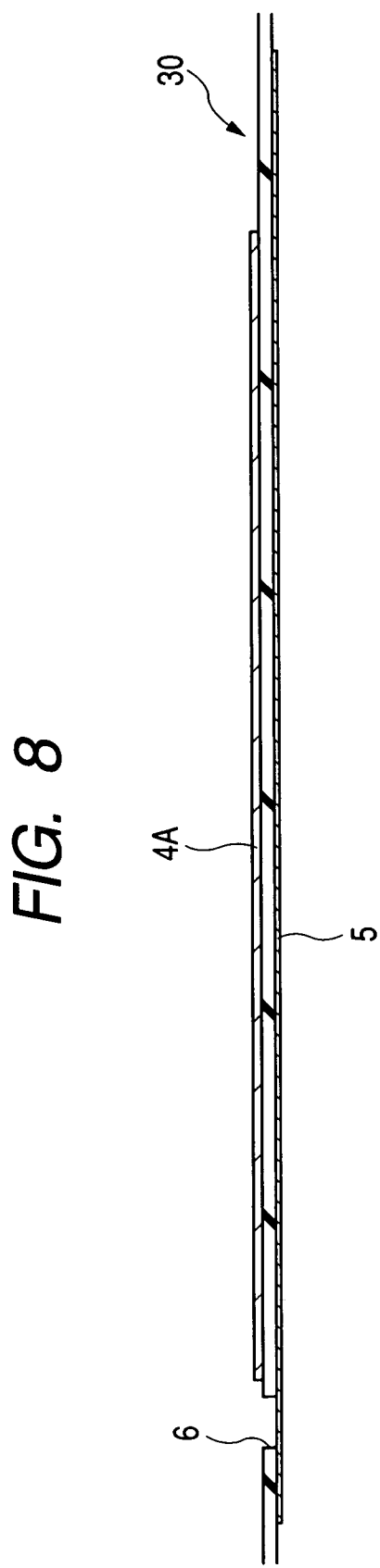
FIG. 8 is a sectional view of a principal portion of the tape substrate, showing a part (chip mounting step) of a process for manufacturing the plug-in UICC.

For assembling the plug-in UICC (1A), first, as shown in FIG. 8, a chip 4A is affixed to one side of the tape substrate 30 with use of an adhesive. As noted earlier, the total area of the contact patterns 5 is larger than the area of the chip 4A, and their peripheral edge portions are positioned outside the peripheral edge portions of the chip 4A. Therefore, a difference in height between the insulating film and the contact patterns 5 does not occur on the adhesive surface of the chip 4A, so that the adhesive surface becomes flat and the strength of bonding between the chip 4A and the tape substrate 30 is improved. On the other hand, in the case where the peripheral edge portions of the contact patterns 5 are positioned within the adhesive surface of the chip 4A, there occurs a difference in height on the adhesive surface, so that the strength of bonding between the chip 4A and the tape substrate 30 is deteriorated. In this case, a portion of the adhesive surface of the chip 4A is covered with the two layers of the insulating film and the contact patterns 5 and the other portion is covered with only the insulating film. Consequently, when an external pressure is applied to a completed plug-in UICC (1A), the chip 4A becomes more susceptible to cracking in the area where the contact patterns 5 are not formed.

Figure 9:
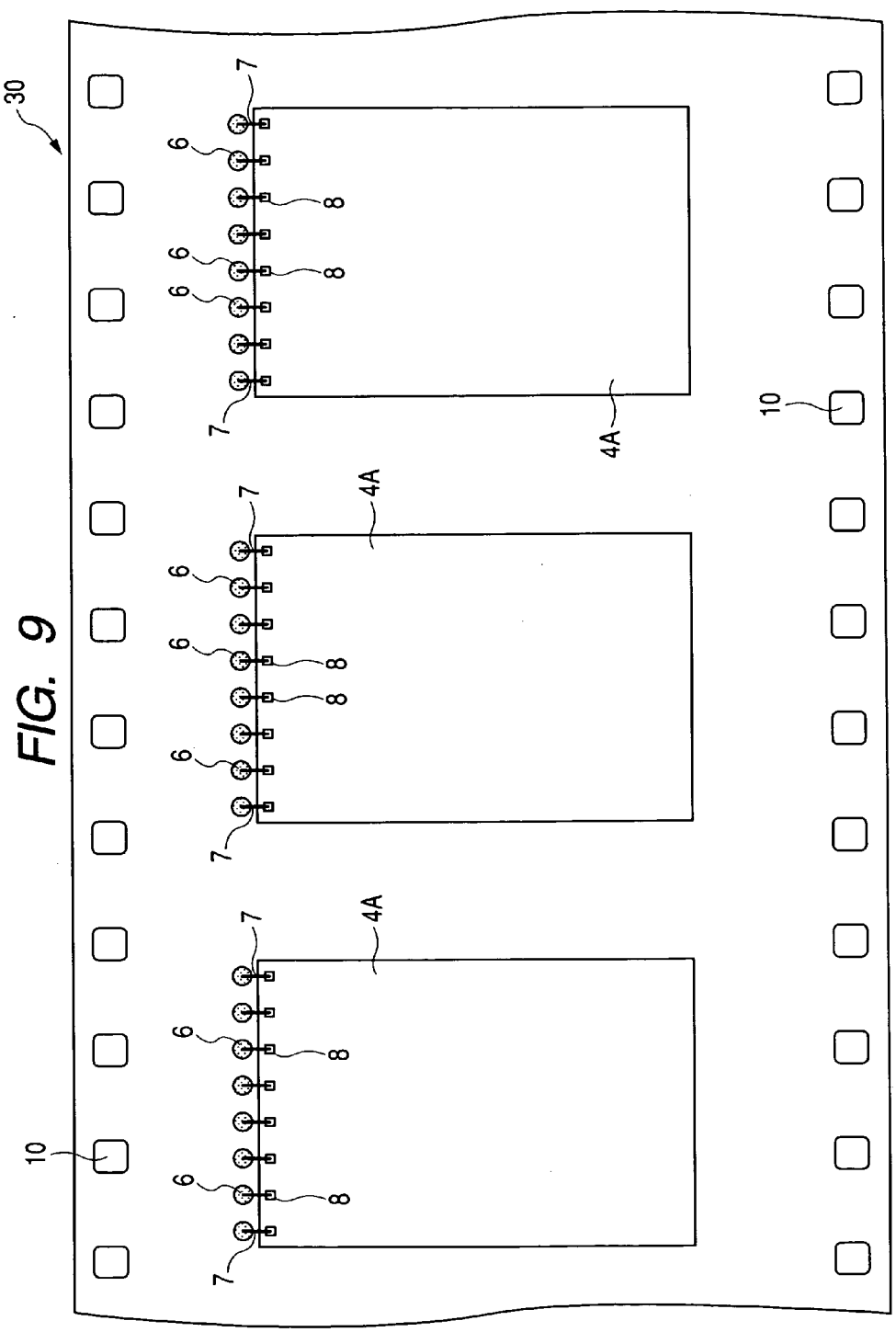
FIG. 9 is a plan view of a principal portion of the tape substrate, showing a part (wire bonding step) of the plug-in UICC manufacturing process.
Figure 10:
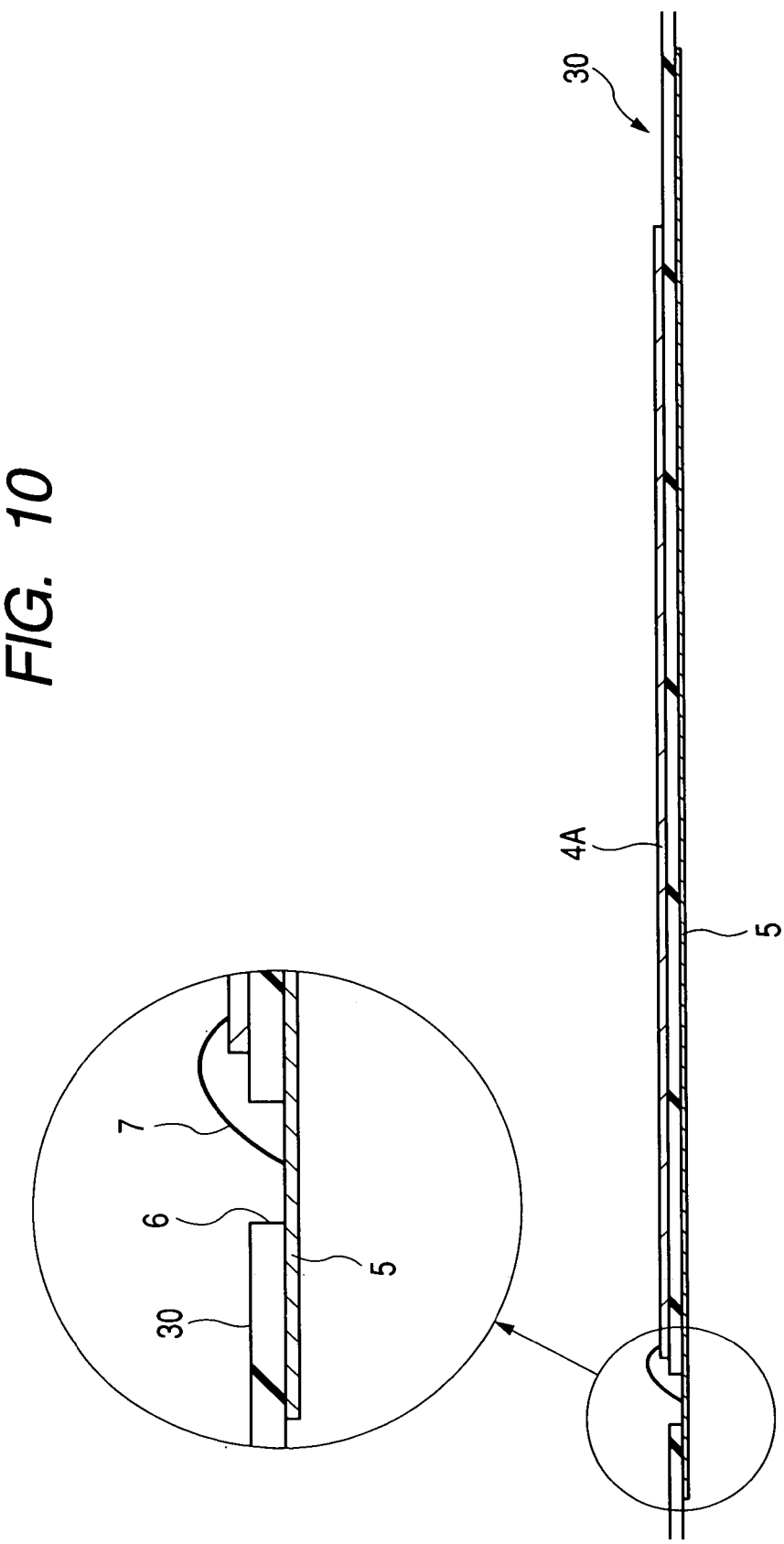
FIG. 10 is a sectional view of a principal portion of the tape substrate, showing a part (wire bonding step) of the plug-in UICC manufacturing process.

Next, as shown in FIGS. 9 and 10, Au wires 7 are bonded to the contact patterns 5 exposed to the bonding holes 6 in the tape substrate 30 and also to bonding pads 8 on the chip 4A to connect the contact patterns 5 and the chip 4A electrically with each other.

Figure 11:
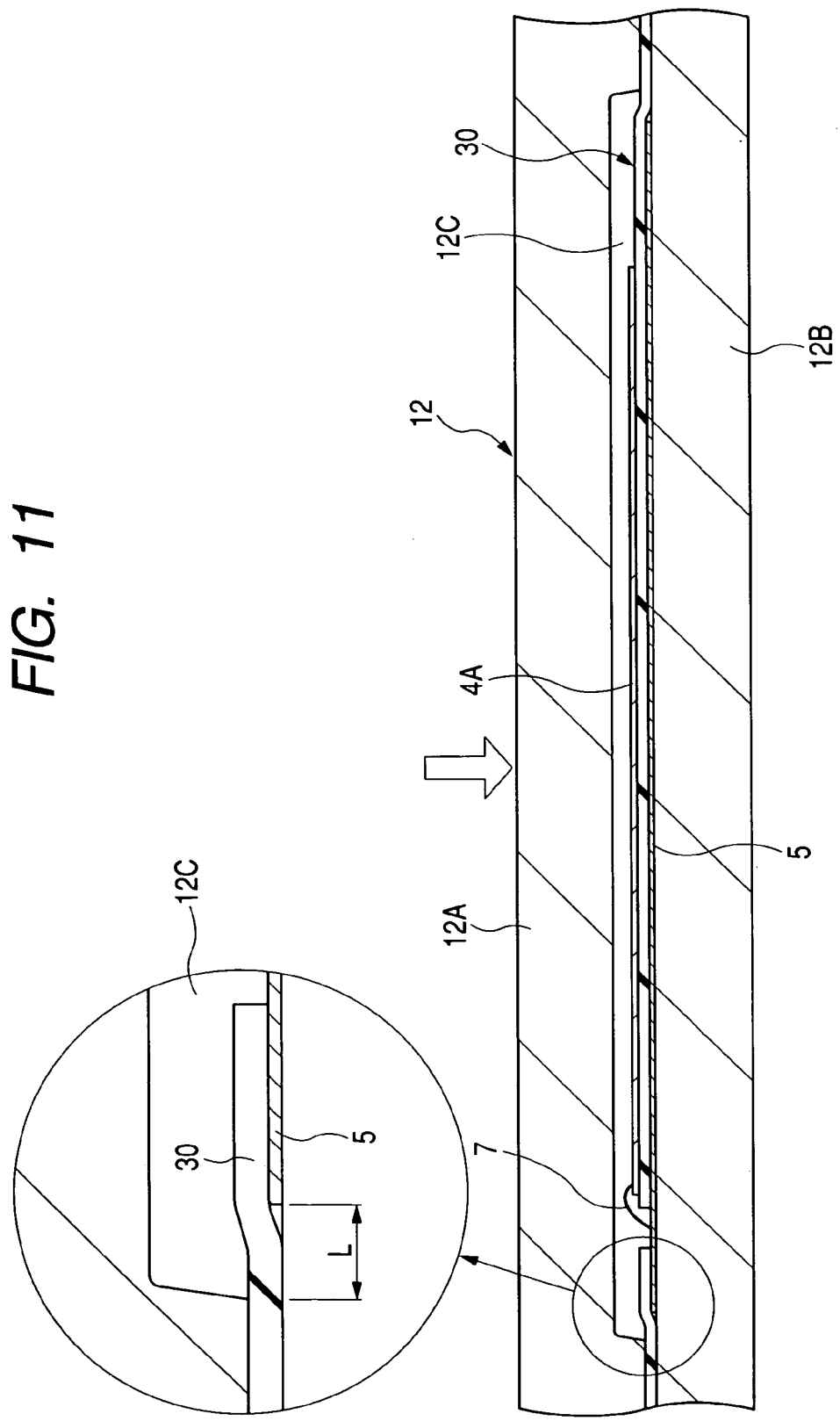
FIG. 11 is a sectional view of a principal portion of a molding die, showing a part (molding step) of the plug-in UICC manufacturing process.

Then, as shown in FIG. 11, the tape substrate 30 is loaded into the molding die 12 and is pinched from both sides by an upper die half 12A and a lower die half 12B. At this time, the peripheral edge portions of the contact patterns 5 formed on the tape substrate 30 are positioned inside end portions of a cavity 12C formed in the upper die half 12A. Therefore, when the tape substrate 30 is loaded into the molding die 12, the contact patterns 5 are not pinched from both sides by the upper and lower die halves 12A, 12B. Thus, there does not occur such an inconvenience that impressions remain on the surfaces of the contact holes 5 by the molding die 12, causing a poor appearance. The distance from an end of the cavity 12C to the peripheral edge portion of the contact pattern 5 opposed thereto (distance L shown in the figure) is set at, for example, 0.2 mm or longer, taking a positional deviation between the molding die 12 and the tape substrate 30 into account.

Figure 12:
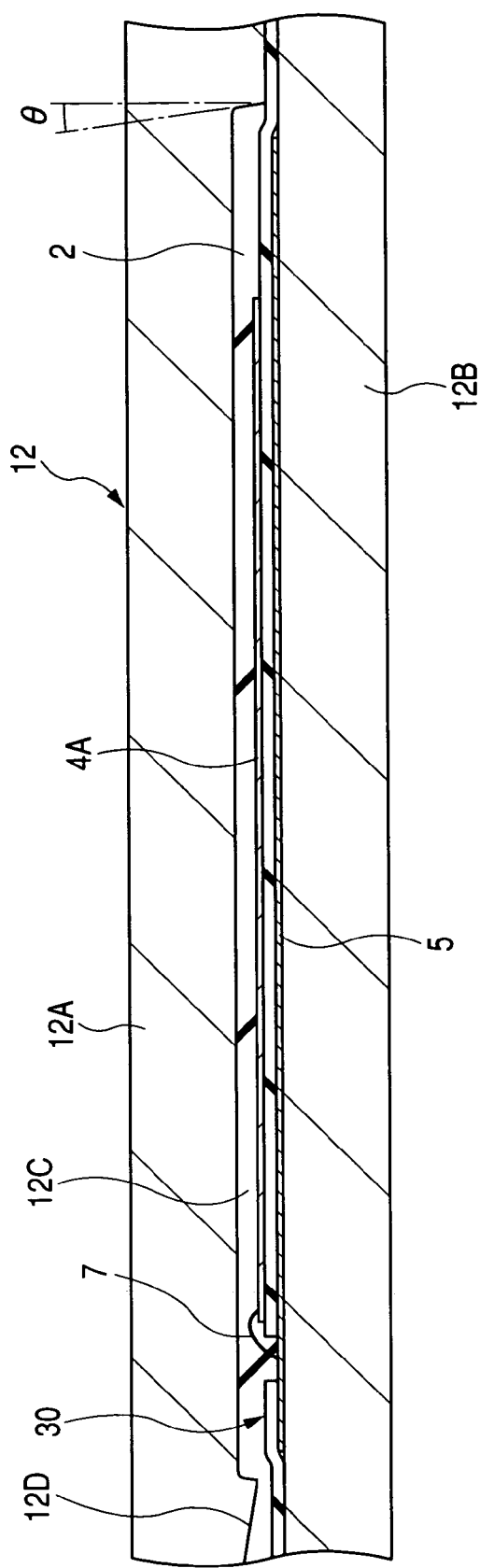
FIG. 12 is a sectional view of a principal portion of the molding die, showing a part (molding step) of the plug-in UICC molding process.

Next, as shown in FIG. 12, the molding resin 2 is injected into the cavity 12C through a gate 12D of the molding die 12 to seal the chip 4A. Though not shown, plural (six, for example) cavities 12C are formed in the molding die 12 so that plural chips 4A can be sealed at one time. Side walls of each cavity 12C are tapered so that the cutting work for the tape substrate 30 can be done easily and accurately in a later pressing step. It is preferable that the angle ($\theta$) of the taper be set at, for example, 5° to 30°.

Figure 13:
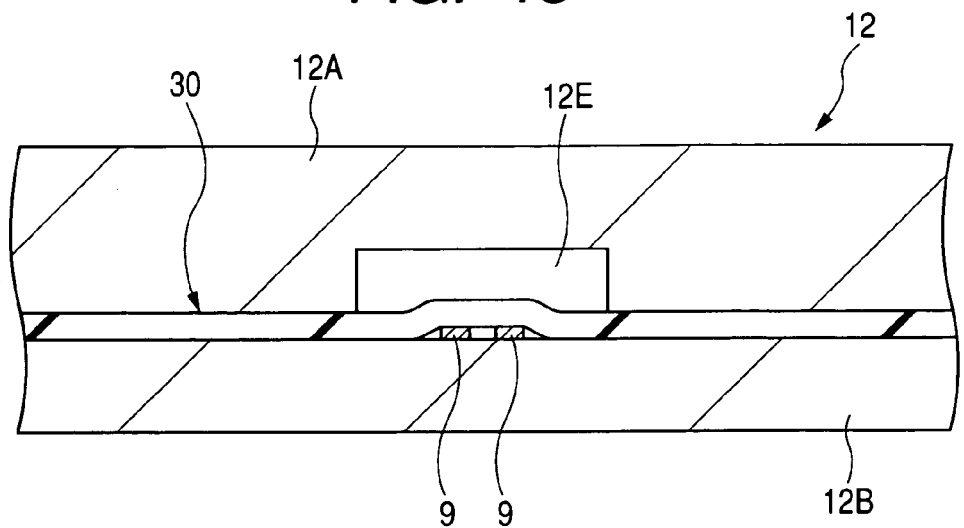
FIG. 13 is a sectional view of a principal portion, showing the positional relation between an air vent formed in the molding die and power supply lines formed on the tape substrate.
Figure 14:
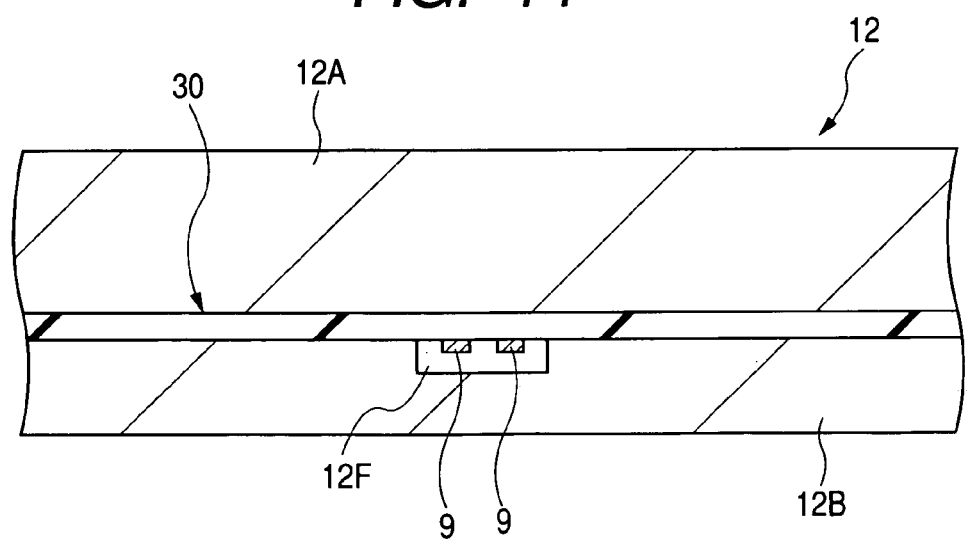
FIG. 14 is a sectional view of a principal portion, showing the positional relation between a groove formed in the molding die and power supply lines formed on the tape substrate.

As described earlier in connection with FIG. 6, power supply lines 9 connected to the contact patterns 5 are formed on both side faces of the tape substrate 30. Therefore, when the tape substrate 30 is pinched from both upper and lower sides by the upper and lower die halves 12A, 12B, there occurs a slight gap between the tape substrate 30 and the upper die half 12A in the vicinity of the power supply lines 9, with a consequent likelihood of resin leakage to the exterior through the gap. As a countermeasure, for example, as shown in FIG. 13, it is proposed that an air vent 12E that is formed in the upper die half 12A be disposed in each area where power supply lines 9 are formed. According to another countermeasure, as shown in FIG. 14, a groove 12F is formed in the lower die half 12B in each area where power supply lines 9 are formed to prevent the occurrence of a gap between the tape substrate 30 and the upper die half 12A in the vicinity of the power supply lines 9. In this case, the power supply lines 9 may be drawn out perpendicularly from the contact patterns 5 toward a side of the tape substrate 30.

Figure 15:
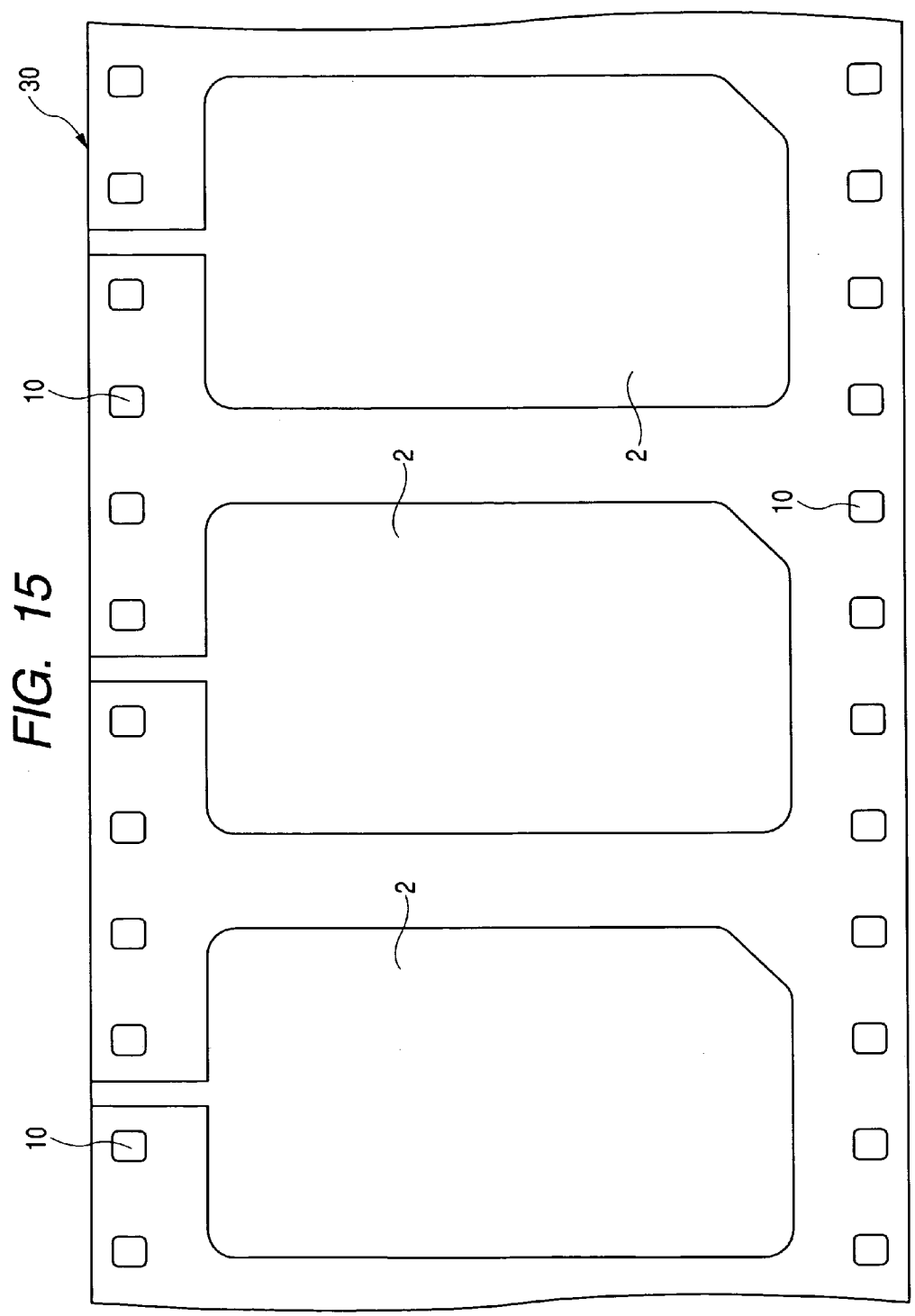
FIG. 15 is a plan view of a principal portion, showing the tape substrate removed from the molding die after sealing semiconductor chips with a molding resin.

FIG. 15 is a plan view of a principal portion, showing the tape substrate 30 as removed from the molding die 12 after sealing the chips 4A with the molding resin 2.

Figure 16:
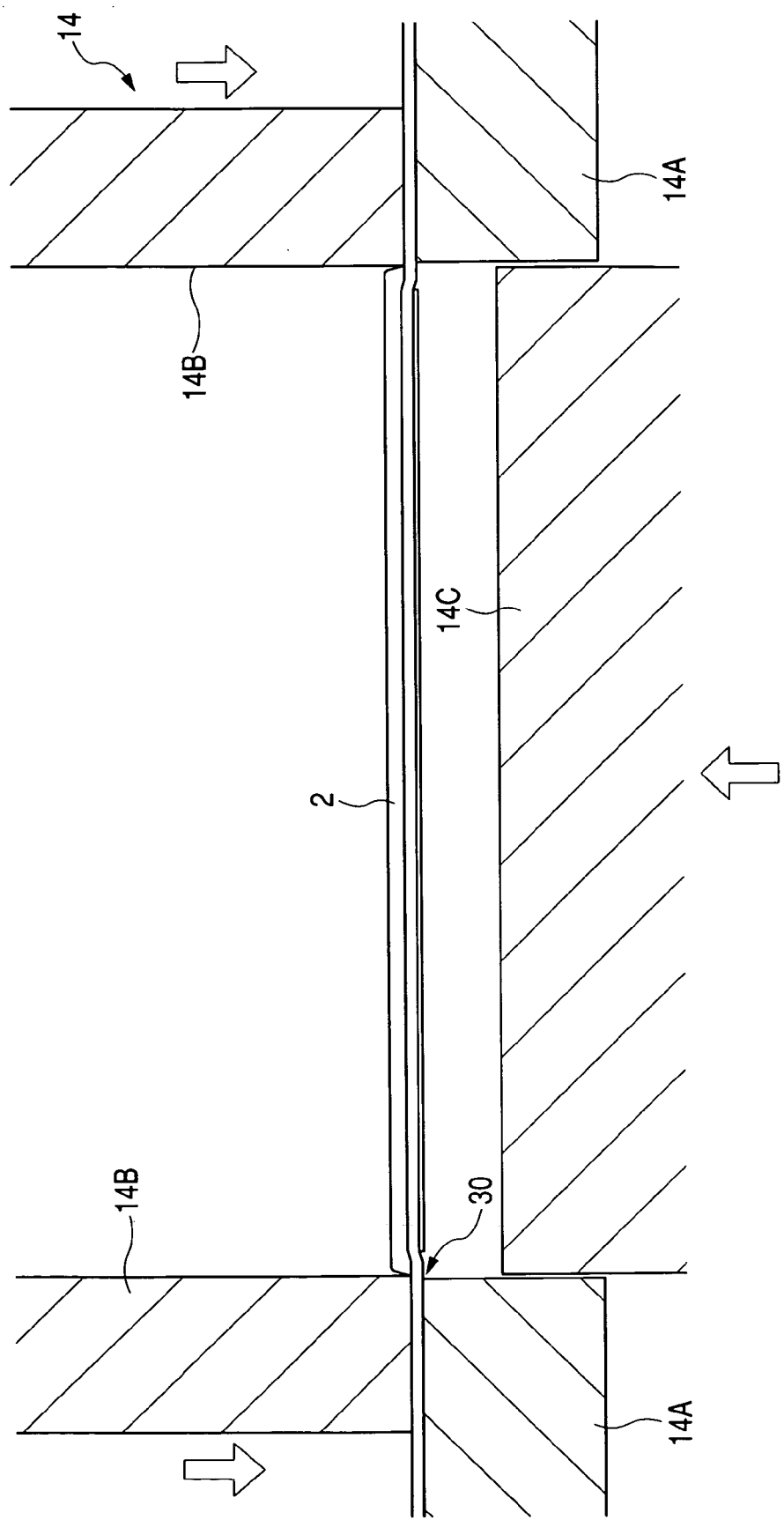
FIG. 16 is a sectional view of a principal portion of a pressing die, showing a part (cutting step) of the plug-in UICC manufacturing process.

Next, after a test is conducted in this state, the tape substrate 30 is cut along the outer periphery of the molding resin 2. This is conducted in the following manner. As shown in FIG. 16, the tape substrate 30 is mounted on a guide 14A of a pressing die 14, and a die 14B is pressed down from above onto the tape substrate 30 to fix the tape substrate; and, thereafter, the tape substrate 30 is cut at positions outside the molding resin 2 with use of a punch 14C to divide the molding resin 2 into individual pieces.

When the die 14B is pressed down against the tape substrate 30 on the guide 14A to fix the tape substrate, if the tape substrate is not positioned accurately, it is impossible to cut the tape substrate 30 accurately along the outer periphery of the molding resin 2. However, if the side faces of the molding resin 2 are tapered, the lower end portions of the die 14B come into contact with the side faces of the molding resin 2 when the die 14B is moved down, and the position of the tape substrate 30 shifts laterally, so that the positioning of the molding resin 2 is effected self-alignmentwise relative to the die 14B, and it becomes possible to cut the tape substrate 30 accurately along the outer periphery of the molding resin 2.

The plug-in UICC (1A) of this embodiment, as shown in FIGS. 1 to 4, is completed through the steps described above. Thus, according to this embodiment, since the body of the plug-in UICC (1A) is constructed of the molding resin 2, it is possible to mount a large-sized chip 4A (or plural chips) in comparison with the conventional plug-in SIM card, wherein a chip is embedded in a plug-in card, so that it is possible to promote a multi-function structure of the plug-in UICC. Besides, the assembling work of affixing the tape substrate 30 to the plug-in card becomes unnecessary. Moreover, by a continuous operation using the long tape substrate 30, it is possible to carry out a chip mounting step, a wire bonding step and a molding step, and, further, it is possible to carry out a checking step due to the power supply lines 9 being independent. Consequently, the manufacturing cost can be reduced in comparison with the conventional plug-in SIM card.

Second Embodiment

Figure 17:
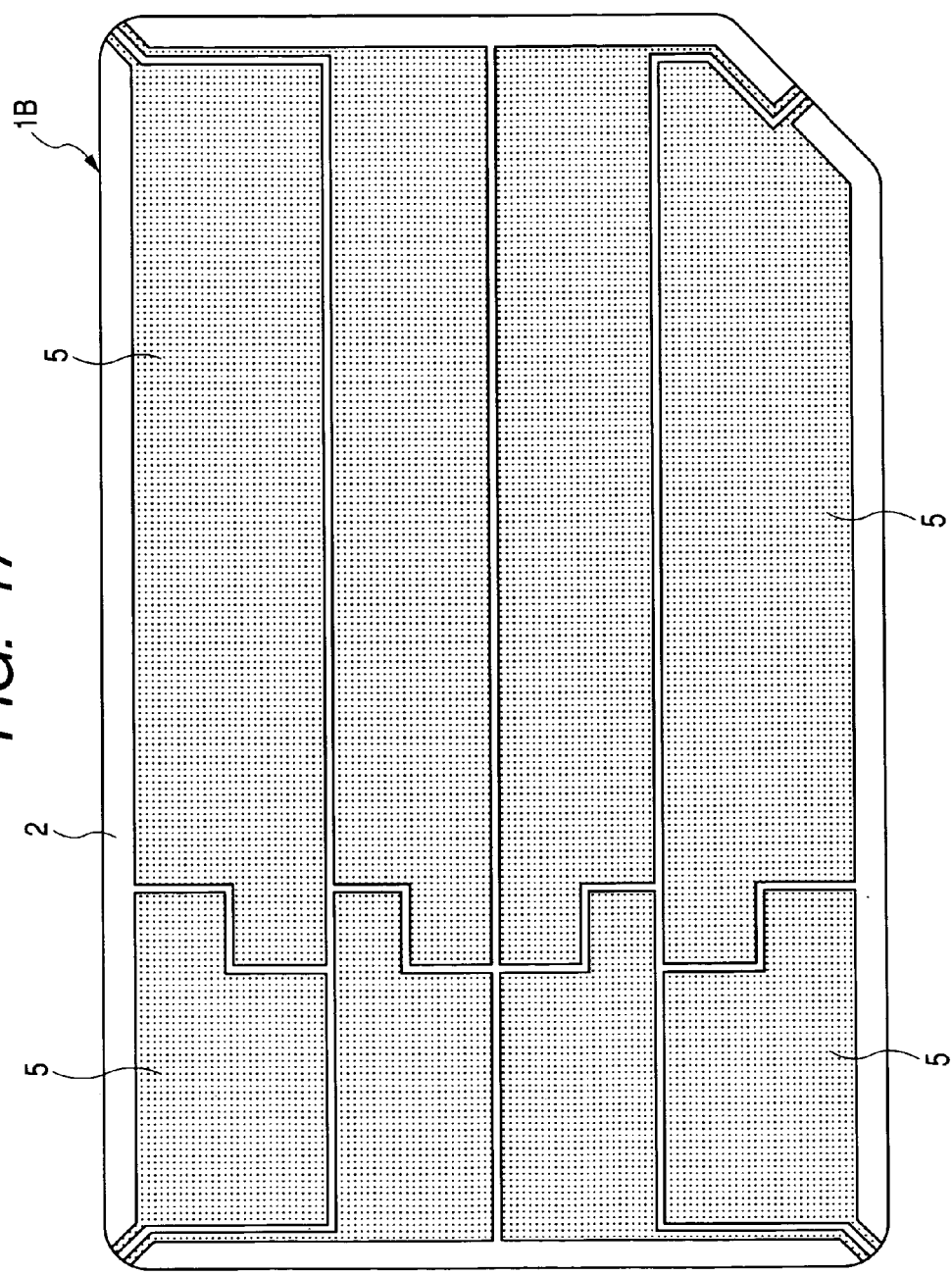
FIG. 17 is a plan view showing an example of the appearance of a plug-in UICC according to a second embodiment of the present invention.
Figure 18:
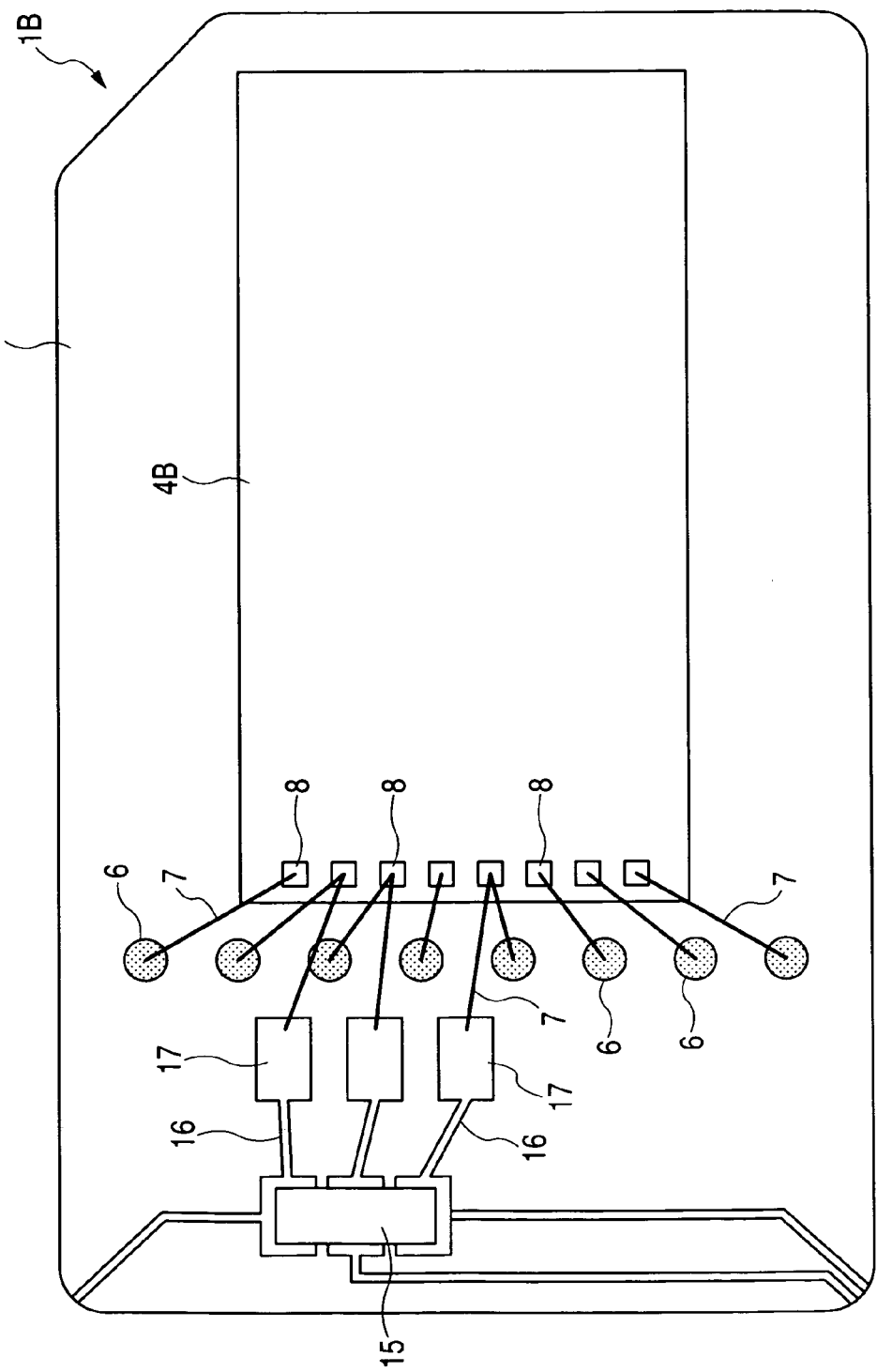
FIG. 18 is a plan view showing an example of the internal structure of the plug-in UICC of the second embodiment as seen from a back surface side thereof.
Figure 19:
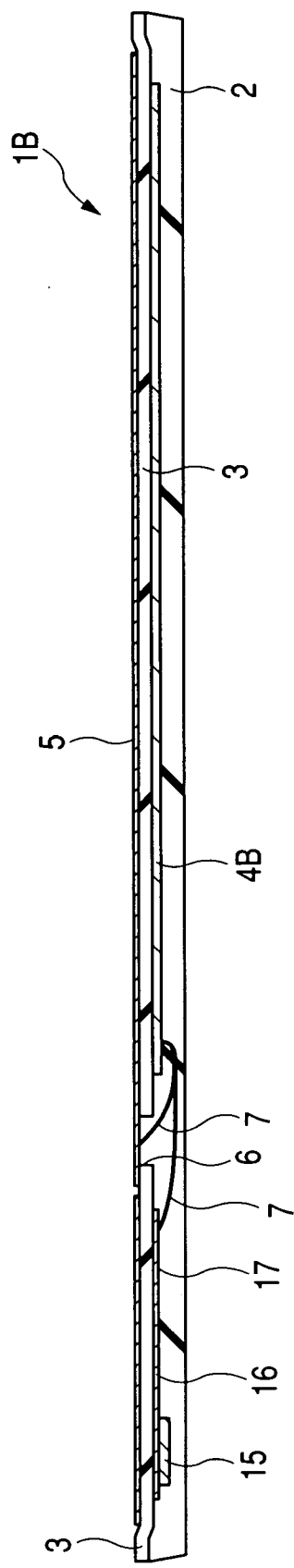
FIG. 19 is a sectional view of the plug-in UICC of the second embodiment.

FIG. 17 is a plan view showing an example of the appearance of a plug-in UICC according to this second embodiment; FIG. 18 is a plan view showing an example of the internal structure of the plug-in UICC, as seen from a back surface side; and FIG. 19 is a sectional view of the plug-in UICC.

The plug-in UICC (1B) of this embodiment has a construction wherein a chip 4B and an oscillator 15 for a USB (Universal Serial Bus) are sealed in the interior of a body constructed of a molding resin 2. On one side of a tape substrate 3, with the chip 4B and the oscillator 15 for USB mounted thereon, there are wiring lines 16 connected to the oscillator 15 and also electrodes 17.

The wiring lines 16 and the electrodes 17 are formed by etching Cu foil affixed to one side of an insulating film to form patterns and, thereafter, plating the surfaces of the patterns with Ni and Au.

The opposite side of the tape substrate 3 is exposed to the exterior of the molding resin 2, and it constitutes a surface portion of the plug-in UICC (1B). Contact patterns 5, serving as external terminals of the plug-in UICC (1B), are formed on the surface of the tape substrate 3 that is exposed to the exterior of the molding resin 2. The contact patterns 5 are formed by etching Cu foil affixed to the opposite side of the insulating film to form patterns and, thereafter, plating the surfaces of the patterns with Ni and Au.

One of the ends of the Au wires 7 are connected to the contact patterns 5 through bonding holes 6 formed in the tape substrate 3, and the contact patterns 5 are connected electrically to bonding pads 8 on the chip 4B through the Au wires 7. The Au wires 7 are connected to both the bonding pads 8 on the chip 4B and to the electrodes 17, and, through the Au wires 7, the chip 4B and the oscillator 15 are electrically connected with each other. Thus, since the tape substrate 3 having a wide area can be sealed in the interior of the molding resin 2 by forming the body of the plug-in UICC (1B) with the molding resin, it is possible to implement the plug-in UICC (1B) containing the oscillator 15 for a USB, which is an electronic part other than the chip 4B. Various electronic parts necessary for extending the function of the plug-in UICC (1B) such as, for example, a chip capacitor for RF (Radio Frequency), can be mounted in addition to the oscillator 15 for USB.

Figure 20:
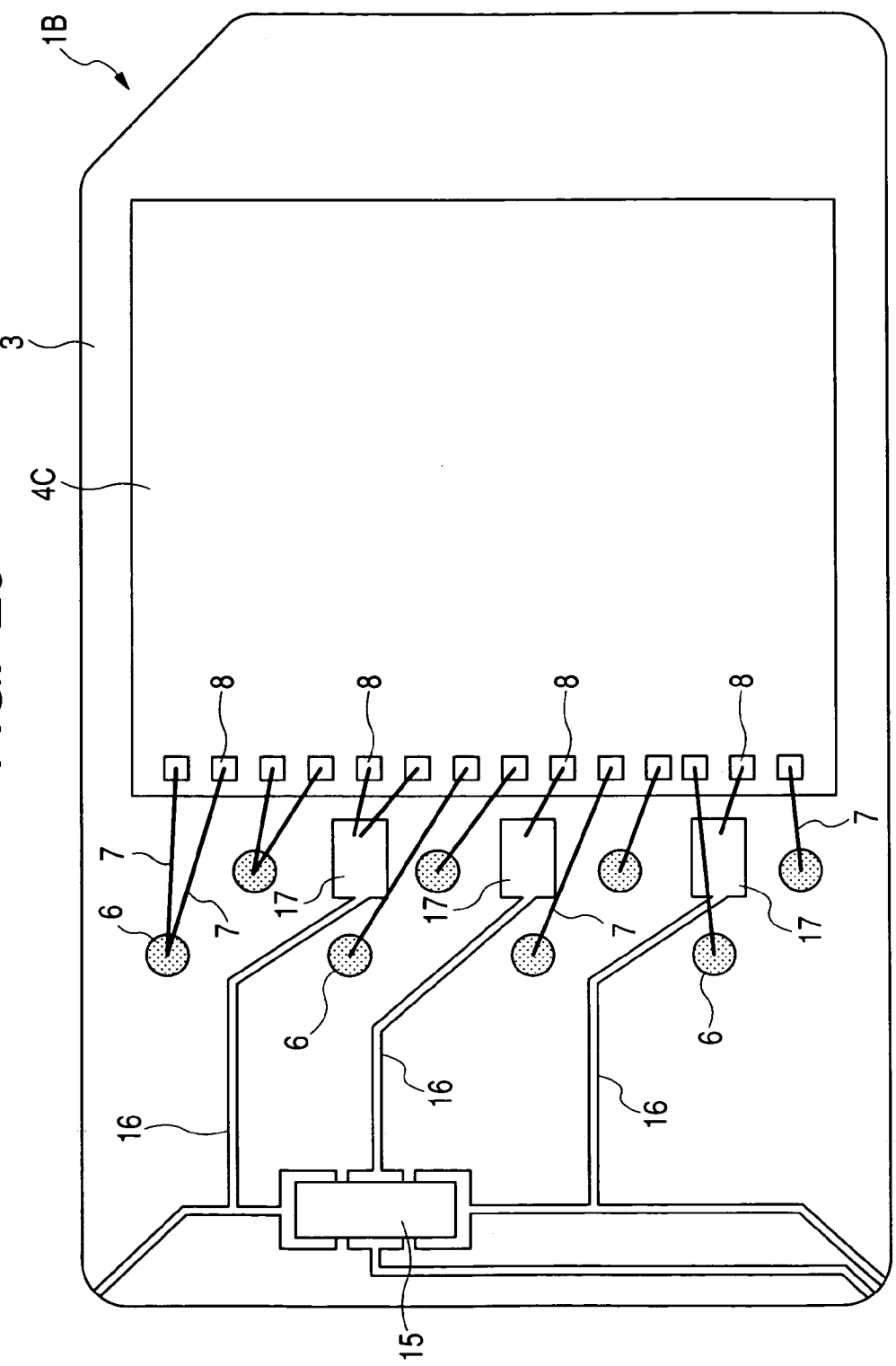
FIG. 20 is a plan view showing an example of the internal structure of a plug-in UICC according to a further embodiment of the present invention.
Figure 21:
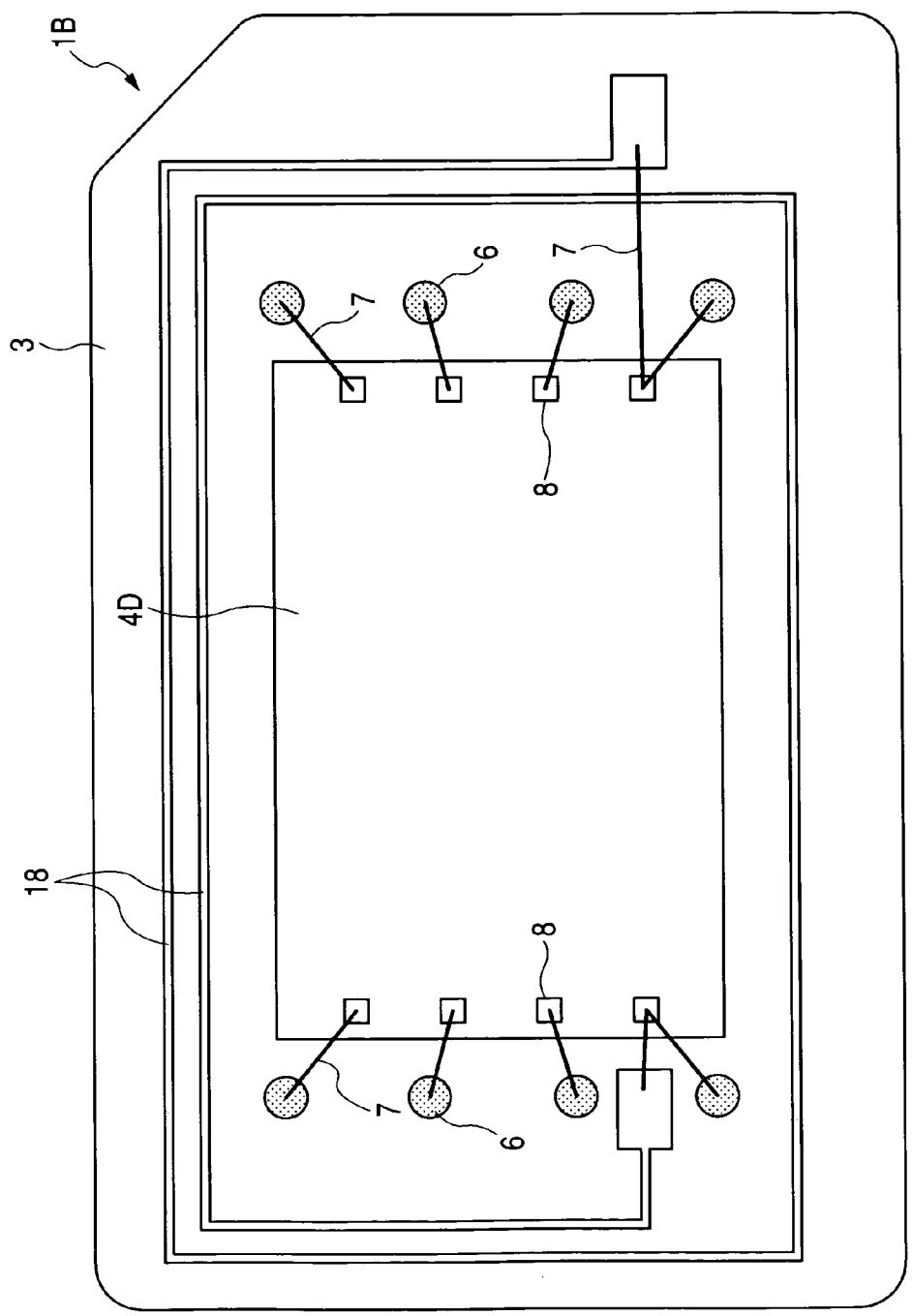
FIG. 21 is a plan view showing an example of the internal structure of a plug-in UICC according to a still further embodiment of the present invention.

FIG. 20 shows an example in which bonding holes 6 are formed in a zigzag pattern in the tape substrate 3 so that electrodes 17 are positioned near a chip 4C. Thus, since the tape substrate 3 having a wide area can be sealed in the interior of the molding resin 2, the degree of freedom in the layout of bonding holes 6, wiring lines 16 and electrodes 17 is also improved. As shown in FIG. 21, booster antenna coils 18 may be formed around a chip 4D by etching Cu foil affixed to one side of an insulating film.

With a single chip configuration of a CPU and a FLASH memory, it is difficult to attain a greater storage capacity and a larger number of functions in the plug-in UICC (1B). This is because the chip area of the FLASH memory becomes larger with an increase in storage capacity, but due to a narrow mounting area, a single chip configuration results in the chip being unreceived within the contour of the card. Therefore, in case of using plural chips, it is effective to divide the chips into a FLASH chip and a chip of other functions, including, for example, an external interface circuit, a CPU, a ROM, a RAM, an EEPROM, and a flash interface circuit.

Figure 22:
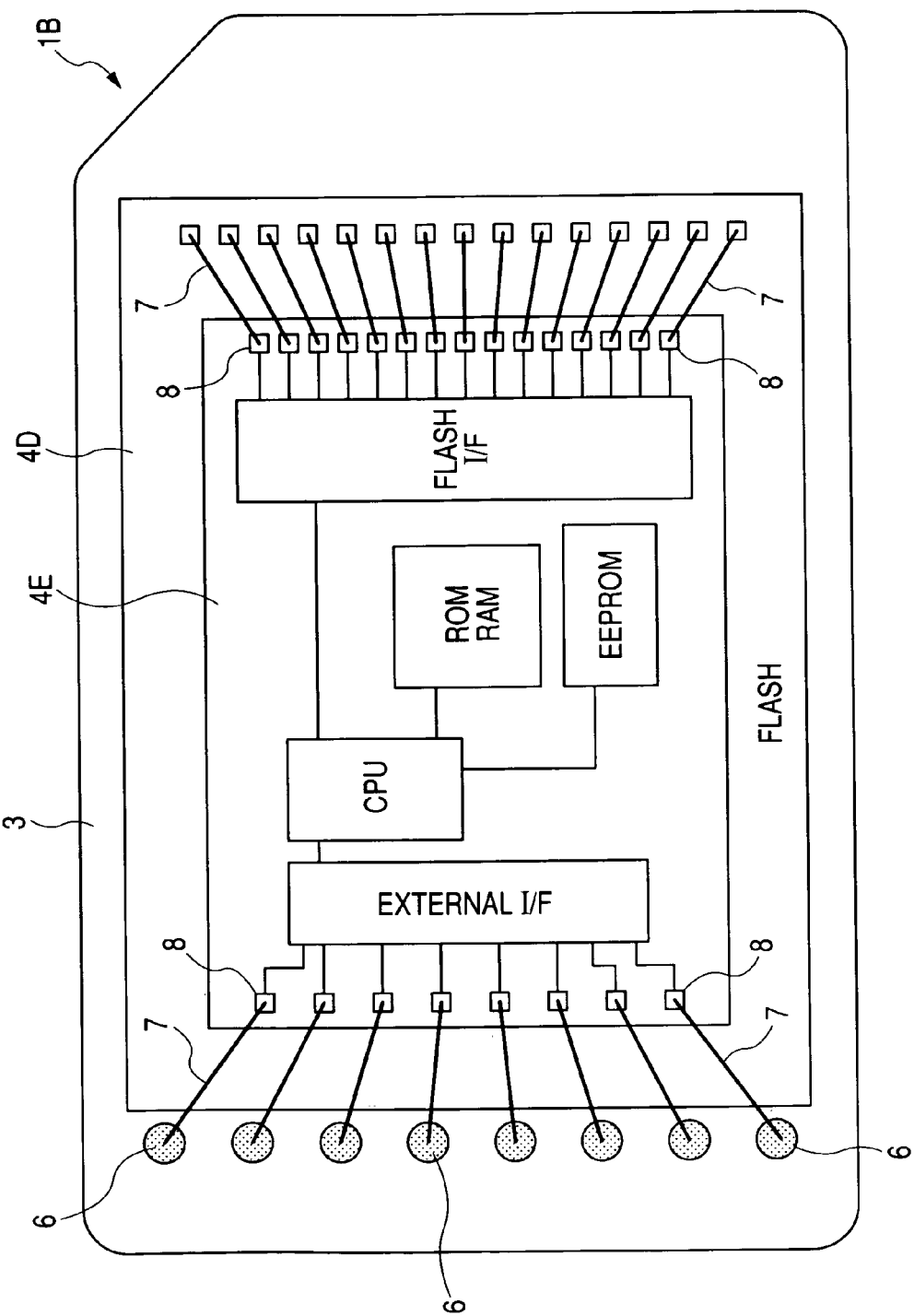
FIG. 22 is a plan view of a plug-in UICC according to a still further embodiment of the present invention.
Figure 23:
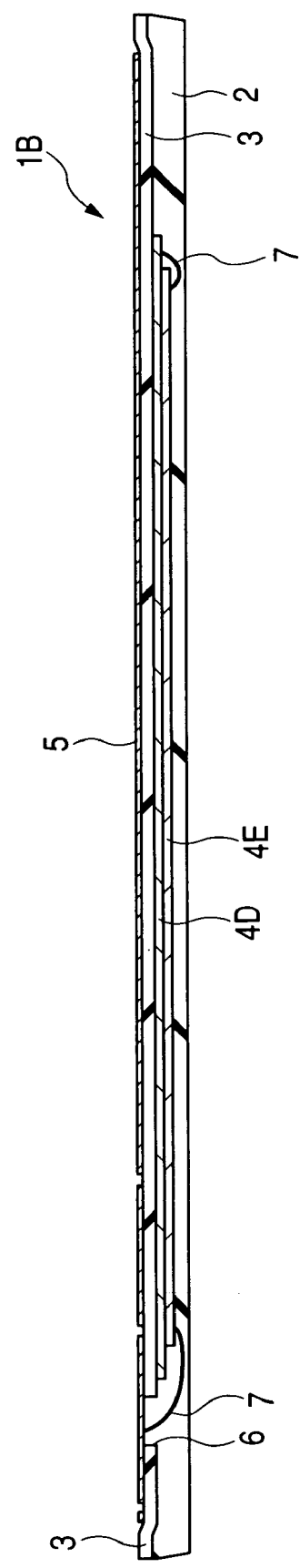
FIG. 23 is a sectional view of the embodiment of FIG. 22.

According to the present invention, by constructing the body of the plug-in UICC (1B) of the molding resin 2, the molding resin 2 can be made thicker than in the conventional plug-in SIM card wherein a chip is embedded in a plug-in card. Consequently, as shown in FIGS. 22 and 23, two chips 4D and 4E can be mounted in a stacked state. In this case, it is preferable that bonding pads 8 of the CPU (chip 4E) be formed on the bonding holes 6 side for high-speed processing. On the other hand, as to the bonding pads 8 of the FLASH memory (chip 4D), since a large number of pins are needed, it is preferable for them to be formed on the side opposite to the bonding pads 8 of the CPU (chip 4E).

Although the present invention has been described above specifically on the basis of embodiments thereof, it goes without saying that the present invention is not limited to the above-described embodiments, but that various changes may be made within a scope not departing from the gist of the invention.

The structures and manufacturing methods as disclosed herein are applicable not only to a plug-in UICC, but also widely to various plug IC cards, including a plug-in SIM card.

The IC card according to the present invention is suitable for application to a plug-in universal IC card for a portable telephone.

What is claimed is:

1. A method of manufacturing an IC card, comprising the steps of:
   (a) providing a tape substrate, the tape substrate having a plurality of chip mounting areas over one side thereof and external terminal patterns formed on opposite sides respectively of the plural chip mounting areas;
   (b) mounting semiconductor chips respectively over the plural chip mounting areas of the tape substrate;
   (c) connecting back surfaces of the external terminal patterns exposed into a plurality of bonding holes formed in the tape substrate and the semiconductor chips electrically with each other through wires;
   (d) loading the tape substrate into a molding die and sealing each of the plural semiconductor chips mounted over the one side of the tape substrate with a molding resin wherein said molding die sets outer peripheries for the molding resin around each of the semiconductor chips; and
   (e) cutting the tape substrate along the outer peripheries of the molding resin, set by the molding die, by means of a press to divide the molding resin into individual pieces such that the planar dimensions of the IC cards are set in accordance with the outer peripheries of the molding resin set by the molding die,
   wherein power supply lines for electrolytically plating surfaces of the external terminal patterns are formed over the opposite side of the tape substrate, a portion of the power supply lines being formed in an area where the power supply lines overlap with air vents of the molding die when the tape substrate is loaded into the molding die.

2. A method according to claim 1, wherein side walls of a cavity of the molding die are tapered to taper side walls of the molding resin.

3. A method according to claim 1, wherein the planar dimensions of the IC cards set in accordance with the outer peripheries of the molding resin set by the molding die are 15 mm×25 mm for each IC card.

4. A method of manufacturing an IC card, comprising the steps of:
- (a) providing a tape substrate, the tape substrate having a front surface and rear surface opposite to the front surface, and having bonding holes;
- (b) forming a plurality of external terminal patterns over the rear surface of the tape substrate;
- (c) mounting a plurality of semiconductor chips over the front surface of the tape substrate;
- (d) connecting the semiconductor chips and external terminal patterns via to the bonding hole by wires;
- (e) pinching the front surface and the rear surface of the tape substrate by a first die and a second die, respectively;
- (f) molding the semiconductor chip and the front surface of the tape substrate by injecting a resin into the between the first die and the second die wherein said first and second dies set outer peripheries for the resin around each of the semiconductor chips in accordance with the locations of the region of the front and rear surface of the tape substrate pinched by the first and second dies; and
- (g) cutting the tape substrate along an outer peripheries of the resin set by the first and second dies, by means of a pressing die such that the planar dimensions of the IC cards are set in accordance with the outer peripheries of the resin set by the first and second dies wherein the first die has an air vent in region where the power supply lines are formed.

5. A method according to claim 4,
wherein the step (b) includes the steps of:
- (b1) forming a conductive film over the rear surface of the tape substrate;
- (b2) forming a plurality of external terminal patterns and power supply lines connected to the external terminal patterns by patterning the conductive film; and
- (b3) electrolytically plating surfaces of the external terminal patterns while supplying the external terminal patterns with an electric current through the power supply lines.

6. A method according to claim 4,
wherein the second die has a groove in the region where the power supply lines are formed.

7. A method according to claim 4,
wherein, in the step (g), the outer peripheries of the resin around each of the semiconductor chips are tapered.

8. A method according to claim 7,
wherein an angle of the taper of the resin is set at 5° to 30°.

9. A method according to claim 4, wherein each of the semiconductor chips includes a flash memory chip.

10. A method according to claim 4, wherein each of the semiconductor chips further includes an interface chip for the flash memory.

11. A method according to claim 4, further comprising the steps of:
- (h) mounting an oscillator for USB over the front surface of the tape substrate;
  wherein, at the step (f), the oscillator for USB is also molded.

12. A method according to claim 4, wherein the planar dimensions of the IC cards set in accordance with the outer peripheries of the resin set by the first and second dies are 15 mm×25 mm for each IC card.

* * * * *